(12) United States Patent
Nakagawa et al.

(10) Patent No.: US 12,308,617 B2
(45) Date of Patent: May 20, 2025

(54) LIGHT EMITTING DEVICE AND PROJECTOR

(71) Applicants: SEIKO EPSON CORPORATION, Tokyo (JP); SOPHIA SCHOOL CORPORATION, Tokyo (JP)

(72) Inventors: Yohei Nakagawa, Tokyo to Shinjuke ku (JP); Shunsuke Ishizawa, Tokyo to Shinjuke ku (JP); Katsumi Kishino, Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 858 days.

(21) Appl. No.: 17/389,359

(22) Filed: Jul. 30, 2021

(65) Prior Publication Data

US 2022/0037859 A1 Feb. 3, 2022

(30) Foreign Application Priority Data

Jul. 31, 2020 (JP) .................................. 2020-129992

(51) Int. Cl.
*H01S 5/11* (2021.01)
*G03B 21/20* (2006.01)
(Continued)

(52) U.S. Cl.
CPC .......... *H01S 5/343* (2013.01); *G03B 21/2033* (2013.01); *H01S 5/11* (2021.01); *H01S 5/2054* (2013.01); *H01S 5/341* (2013.01)

(58) Field of Classification Search
CPC ........................................................ H01S 5/11
See application file for complete search history.

(56) References Cited

U.S. PATENT DOCUMENTS

| 2016/0254138 A1 | 9/2016 | Kikuchi et al. | |
| 2019/0267775 A1* | 8/2019 | Noda | H01S 5/3063 |

(Continued)

FOREIGN PATENT DOCUMENTS

| JP | 2004111766 | 4/2004 |
| JP | 2019054127 | 4/2019 |
| WO | 2006025407 | 3/2006 |

*Primary Examiner* — Minsun O Harvey
*Assistant Examiner* — Stephen Sutton Kotter
(74) *Attorney, Agent, or Firm* — JCIPRNET

(57) ABSTRACT

In a light emitting device, a first diametrical size that is the largest size of a columnar part between a substrate side of a light emitting layer and an opposite side of the substrate, the columnar part has a size no larger than the first diametrical size in an area between the substrate side of the light emitting layer and the substrate side of a first semiconductor layer, the columnar part has a size smaller than the first diametrical size in the area between the substrate side of the light emitting layer and the substrate side of the first semiconductor layer, the columnar part has a size no larger than the first diametrical size in an area between the opposite side to the substrate of the light emitting layer, and an opposite side to the substrate of a second semiconductor layer, and the columnar part has a size smaller than the first diametrical size in the area between the opposite side to the substrate of the light emitting layer in the laminating direction, and the opposite side to the substrate of the second semiconductor layer.

12 Claims, 7 Drawing Sheets

(51) Int. Cl.
*H01S 5/20* (2006.01)
*H01S 5/343* (2006.01)
*H01S 5/34* (2006.01)

(56) References Cited

U.S. PATENT DOCUMENTS

2020/0036163 A1* 1/2020 Nishioka .................. H01S 5/11
2020/0274330 A1   8/2020 Nagawa et al.
2020/0279974 A1* 9/2020 Noda .................... H01L 27/153
2020/0313040 A1* 10/2020 Nishioka ............ G03B 21/2066

* cited by examiner

LIGHT EMITTING DEVICE AND PROJECTOR

The present application is based on, and claims priority from JP Application Serial Number 2020-129992, filed Jul. 31, 2020, the disclosure of which is hereby incorporated by reference herein in its entirety.

BACKGROUND

1. Technical Field

The present disclosure relates to a light emitting device and a projector.

2. Related Art

In a laser due to a photonic crystal using a column crystal, the photonic crystal effect is developed making use of a difference in refractive index between a columnar part and a space between the columnar parts. The columnar part is constituted by, for example, a first semiconductor layer of the n-type, a second semiconductor layer of the p-type, and an active layer disposed between the first semiconductor layer and the second semiconductor layer. In such a columnar part, it is desired to increase an average refractive index in the active layer to improve the optical confinement factor in a laminating direction.

For example, in JP-A-2019-54127 (Document 1), there is described a light emitting device in which a light propagation layer is disposed between the active layers, a first low-refractive index part is disposed between the first semiconductor layers, and a second low-refractive index part is disposed between the second semiconductor layer in the columnar parts adjacent to each other in order to improve the optical confinement factor. In Document 1, after forming the columnar part, the light propagation layer is embedded between the active layers of the columnar parts adjacent to each other to form an air gap to be the first low-refractive index part between the light propagation layer and a substrate.

However, when a distance between the columnar parts adjacent to each other is long, the space between the columnar parts adjacent to each other is filled with the light propagation layer, and thus, the air gap fails to be formed in some cases. Further, when the distance between the columnar parts adjacent to each other is short, the space between the active layers of the columnar parts adjacent to each other fails to be filled with the light propagation layer in some cases. As described above, in Document 1, it is difficult to control the position in the laminating direction of the light propagation layer, and the optical confinement factor fails to be improved in some cases.

SUMMARY

A light emitting device according to an aspect of the present disclosure includes a substrate, and a laminated structure provided to the substrate, and including a plurality of columnar parts, wherein the columnar part includes a first semiconductor layer, a second semiconductor layer different in conductivity type from the first semiconductor layer, and a light emitting layer disposed between the first semiconductor layer and the second semiconductor layer, the first semiconductor layer is disposed between the substrate and the light emitting layer, defining a largest diametrical size of the columnar part between an end at the substrate side of the light emitting layer in a laminating direction of the first semiconductor layer and the light emitting layer, and an end at an opposite side to the substrate of the light emitting layer in the laminating direction as a first diametrical size, the columnar part has a diametrical size no larger than the first diametrical size in an entire area between the end at the substrate side of the light emitting layer and an end at the substrate side of the first semiconductor layer in the laminating direction, the columnar part has a diametrical size smaller than the first diametrical size in at least a part of the area between the end at the substrate side of the light emitting layer in the laminating direction and the end at the substrate side of the first semiconductor layer, the columnar part has a diametrical size no larger than the first diametrical size in an entire area between the end at the opposite side to the substrate of the light emitting layer, and an end at an opposite side to the substrate of the second semiconductor layer in the laminating direction, and the columnar part has a diametrical size smaller than the first diametrical size in at least a part of the area between the end at the opposite side to the substrate of the light emitting layer in the laminating direction, and the end at the opposite side to the substrate of the second semiconductor layer.

In the light emitting device according to the aspect, the columnar part may have a diametrical size smaller than the first diametrical size in an entire area between the end at the substrate side of the light emitting layer in the laminating direction and the end at the substrate side of the first semiconductor layer, and the columnar part may have a diametrical size smaller than the first diametrical size in the entire area between the end at the opposite side to the substrate of the light emitting layer in the laminating direction, and the end at the opposite side to the substrate of the second semiconductor layer.

In the light emitting device according to the aspect, the first semiconductor layer may have a first center in the laminating direction, the second semiconductor layer may have a second center in the laminating direction, the light emitting layer may have a third center in the laminating direction, and a diametrical size of the columnar part at the third center may be larger than a diametrical size of the columnar part at the first center, and a diametrical size of the columnar part at the second center.

In the light emitting device according to the aspect, in the columnar parts adjacent to each other, one of the columnar parts and another of the columnar parts may have contact with each other at a position at the third center in the laminating direction.

In the light emitting device according to the aspect, there may be a crystal defect in an interface between the one of the columnar parts and the other of the columnar parts at the position of the third center in the laminating direction.

In the light emitting device according to the aspect, the light emitting layer may include a well layer, and a barrier layer larger in bandgap than the well layer, and the barrier layer of the one of the columnar parts and the barrier layer of the other of the columnar parts may have contact with each other at the position of the third center in the laminating direction.

In the light emitting device according to the aspect, in a plan view from the laminating direction, the second semiconductor layer may be disposed around the light emitting layer, and the second semiconductor layer of the one of the columnar parts and the second semiconductor layer of the other of the columnar parts may have contact with each other at the position of the third center in the laminating direction.

In the light emitting device according to the aspect, in the columnar parts adjacent to each other, one of the columnar parts and another of the columnar parts may be separated from each other.

In the light emitting device according to the aspect, the diametrical size at the second center of the columnar part may be smaller than the diametrical size at the first center of the columnar part.

In the light emitting device according to the aspect, in a plan view from the laminating direction, the second semiconductor layer may be disposed around the light emitting layer.

A projector according to another aspect of the present disclosure includes the light emitting device according to the above aspect.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment 1.1. Light Emitting Device

Figure 1:
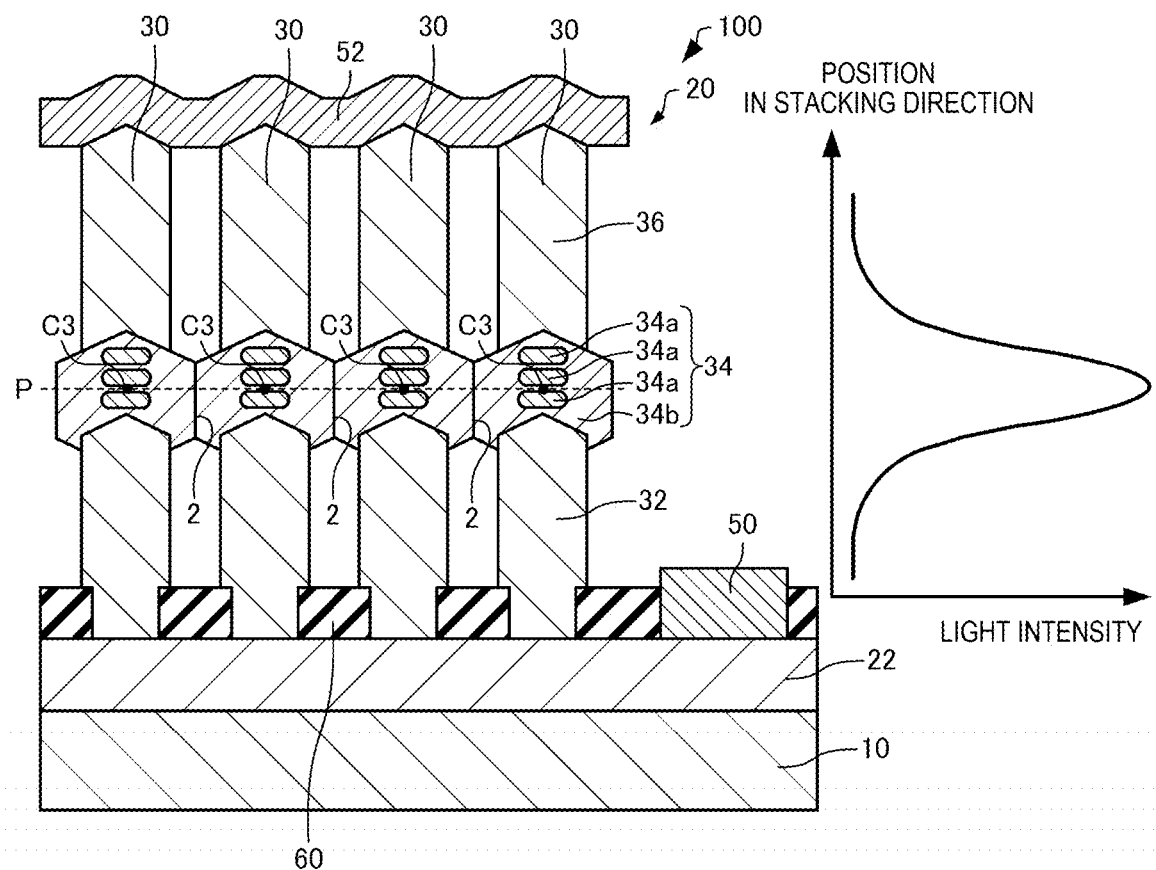
FIG. 1 is a cross-sectional view schematically showing a light emitting device according to a first embodiment.
Figure 2:
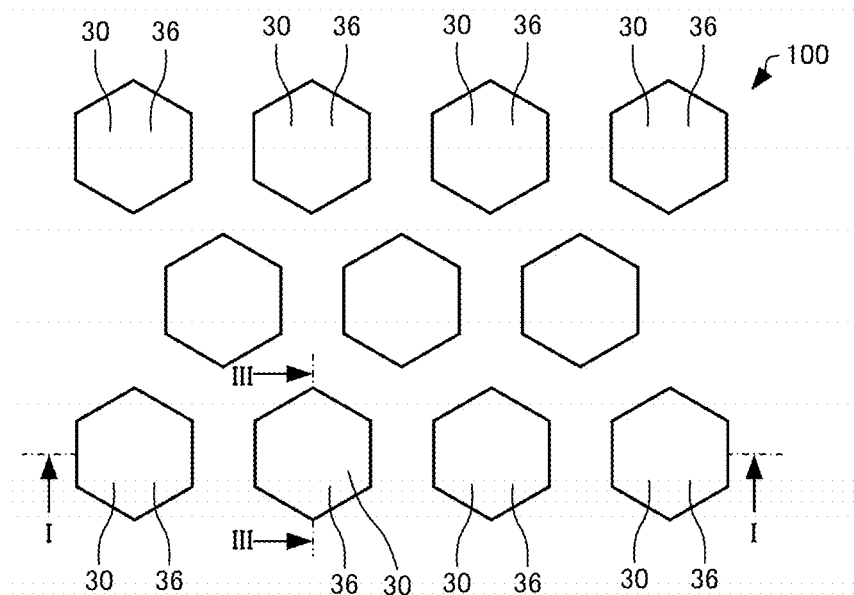
FIG. 2 is a plan view schematically showing the light emitting device according to the first embodiment.

First, a light emitting device according to a first embodiment will be described with reference to the drawings. FIG. 1 is a cross-sectional view schematically showing the light emitting device 100 according to the first embodiment. FIG. 2 is a plan view schematically showing the light emitting device 100 according to the first embodiment. It should be noted that in FIG. 2, second semiconductor layers 36 of columnar parts 30 are illustrated alone for the sake of convenience. Further, FIG. 1 is a cross-sectional view along the line I-I shown in FIG. 2.

As shown in FIG. 1, the light emitting device 100 has a substrate 10, a laminated structure 20, a first electrode 50, and a second electrode 52.

The substrate 10 has, for example, a plate-like shape. The substrate 10 is, for example, an Si substrate, a GaN substrate, or a sapphire substrate.

The laminated structure 20 is provided to the substrate 10. The laminated structure 20 has, for example, a buffer layer 22 and a plurality of columnar parts 30.

The buffer layer 22 is disposed on the substrate 10. The buffer layer 22 is, for example, an Si-doped n-type GaN layer. On the buffer layer 22, there is disposed a mask layer 60 for forming the columnar parts 30. The mask layer 60 is, for example, a silicon oxide layer, a titanium layer, a titanium oxide layer, or an aluminum oxide layer.

In the present specification, when taking the light emitting layer 34 as a reference in the laminating direction of the laminated structure 20 (hereinafter also referred to simply as a "laminating direction"), the description will be presented assuming a direction from the light emitting layer 34 toward the second electrode 52 as an "upward direction," and a direction from the light emitting layer 34 toward the substrate 10 as a "downward direction." Further, the "laminating direction of the laminated structure" means a laminating direction of the first semiconductor layer 32 and the light emitting layer 34. Further, a direction perpendicular to the laminating direction is also referred to as an "in-plane direction."

The columnar parts 30 are disposed on the buffer layer 22. The columnar parts 30 each have a columnar shape protruding upward from the buffer layer 22. The columnar part 30 is also referred to as, for example, a nano-column, a nano-wire, a nano-rod, or a nano-pillar. The planar shape of the columnar part 30 is, for example, a polygonal shape or a circle. In the example shown in FIG. 2, the planar shape of the second semiconductor layer 36 of the columnar part 30 is a hexagonal shape.

The number of the columnar parts 30 disposed is two or more. The columnar parts 30 are arranged at a predetermined pitch in a predetermined direction in a plan view from the laminating direction (hereinafter also referred to simply as "in the plan view"). The plurality of columnar parts 30 is arranged so as to form a triangular grid. The shortest pitch of the columnar parts 30 is, for example, about 250 nm. It should be noted that the arrangement of the plurality of columnar parts 30 is not particularly limited, and the plurality of columnar parts 30 can be arranged to form a square grid. The plurality of columnar parts 30 can develop an effect of a photonic crystal.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

As shown in FIG. 1, the columnar parts 30 each have the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is an n-type semiconductor layer. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layer 36. The light emitting layer 34 generates light in response to injection of an electrical current.

The light emitting layer 34 has, for example, a multiple quantum well structure obtained by stacking quantum well structures each constituted by a well layer 34a and a barrier layer 34b on one another. The well layer 34a is, for example, an i-type InGaN layer doped with no impurity. The barrier layer 34b is, for example, an i-type GaN layer doped with no impurity. The barrier layer 34b has a bandgap larger than the bandgap of the well layer 34a. It should be noted that in FIG. 1, the plurality of barrier layers 34b is illustrated as a common layer for the sake of convenience. In a plan view, the barrier layers 34b are disposed around the well layers 34a. In the illustrated example, the light emitting layer 34 is a core-shell type light emitting layer in which the barrier layers 34b cover the well layers 34a.

The second semiconductor layer 36 is disposed on the light emitting layer 34. The second semiconductor layer 36 is a layer different in conductivity type from the first semiconductor layer 32. The second semiconductor layer 36 is a p-type semiconductor layer. The second semiconductor layer 36 is, for example, an Mg-doped p-type GaN layer, an Mg-doped p-type InGaN layer, or an Mg-doped p-type AlGaN layer. The first semiconductor layer 32 and the second semiconductor layer 36 are cladding layers having a function of confining the light in the light emitting layer 34. In the illustrated example, an upper surface of the first semiconductor layer 32, an upper surface of the light emitting layer 34, and an upper surface of the second semiconductor layer 36 are each a faceted surface.

Figure 3:
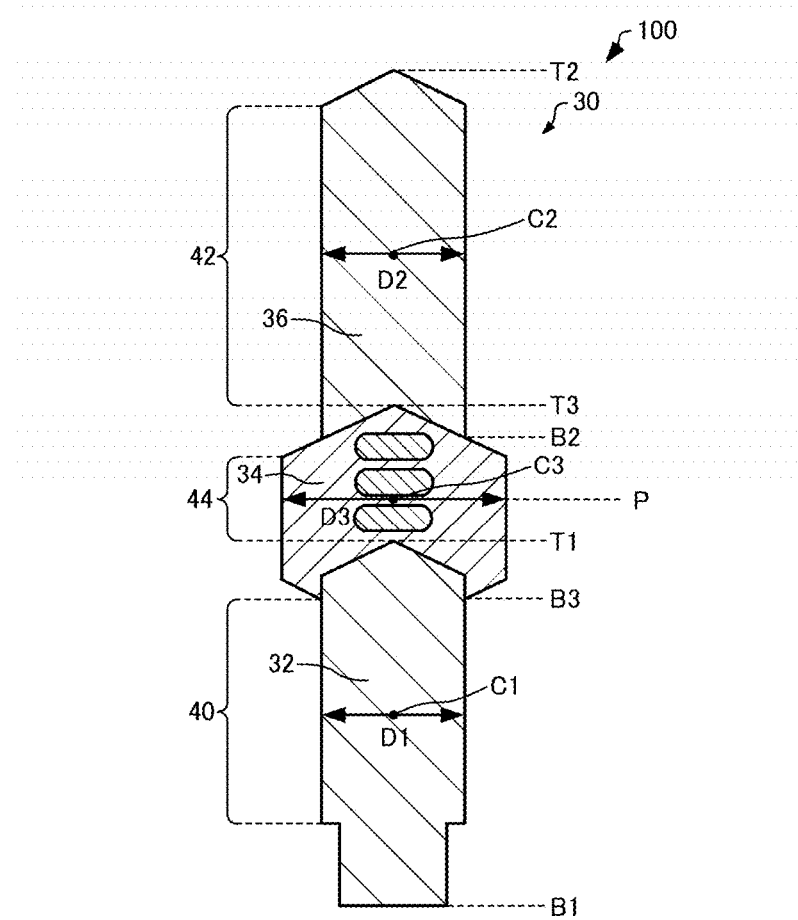
FIG. 3 is a cross-sectional view schematically showing a columnar part of the light emitting device according to the first embodiment.

Here, FIG. 3 is a cross-sectional view along the III-III line shown in FIG. 2 schematically showing the columnar part 30.

As shown in FIG. 3, the first semiconductor layer 32 has a first center C1 in the laminating direction. The first center C1 is located at the midpoint in the laminating direction between a position B1 closest to the substrate 10 in the first semiconductor layer 32 and a position T1 closest to the second electrode 52 in the first semiconductor layer 32. The position B1 is an end at the substrate 10 side of the first semiconductor layer 32. The position T1 is an end at an opposite side to the substrate 10 of the first semiconductor layer 32.

The second semiconductor layer 36 has a second center C2 in the laminating direction. The second center C2 is located at the midpoint in the laminating direction between a position B2 closest to the substrate 10 in the second semiconductor layer 36 and a position T2 closest to the second electrode 52 in the second semiconductor layer 36. The position B2 is an end at the substrate 10 side of the second semiconductor layer 36. The position T2 is an end at an opposite side to the substrate 10 of the second semiconductor layer 36.

The light emitting layer 34 has a third center C3 in the laminating direction. The third center C3 is located at the midpoint in the laminating direction between a position B3 closest to the substrate 10 in the light emitting layer 34 and a position T3 closest to the second electrode 52 in the light emitting layer 34. The centers C1, C2, and C3 are located at the center of the columnar part 30 in the plan view. The laminating direction of the first semiconductor layer 32 and the light emitting layer 34 is a direction of an imaginary line not shown passing through the center C1 and the center C3. The position B3 is an end at the substrate 10 side of the light emitting layer 34. The position T3 is an end at an opposite side to the substrate 10 of the light emitting layer 34.

A diametrical size D3 at the third center C3 of the columnar part 30 is larger than a diametrical size D1 at the first center C1 of the columnar part 30, and a diametrical size D2 at the second center C2 of the columnar part 30. In the illustrated example, the diametrical size D1 at the first center C1 of the columnar part 30 and the diametrical size D2 at the second center of the columnar part 30 are the same.

The diametrical size D1 at the first center C1 of the columnar part 30 is, for example, no smaller than 50 nm and no larger than 500 nm, and preferably no smaller than 100 nm and no larger than 200 nm. By setting the diametrical size D1 to be no larger than 500 nm, it is possible to obtain the light emitting layer 34 made of crystals high in quality, and at the same time, it is possible to reduce the distortion inherent in the light emitting layer 34. Thus, it is possible to amplify the light generated in the light emitting layer 34 with high efficiency. The first semiconductor layers 32 of the respective columnar parts 30 have diametrical sizes, for example, equal to each other, namely the diametrical size D1. In the columnar parts 30 adjacent to each other, a distance between the first semiconductor layer 32 of one of the columnar parts 30 and the first semiconductor layer 32 of the other of the columnar parts 30 is, for example, no smaller than 1 nm and no larger than 500 nm.

It should be noted that when the planar shape of the first semiconductor layer 32 of the columnar part 30 is a circle, the "diametrical size of the first semiconductor layer of columnar part" means the diameter of the circle, and when the planar shape of the first semiconductor layer 32 of the columnar part 30 is not a circular shape, the "diametrical size of the first semiconductor layer of the columnar part" means the diameter of the minimum bounding circle. For example, when the planar shape of the first semiconductor layer 32 of the columnar part 30 is a polygonal shape, the diametrical size of the first semiconductor layer 32 of the columnar part 30 is the diameter of a minimum circle including the polygonal shape inside, and when the planar shape of the first semiconductor layer 32 of the columnar part 30 is an ellipse, the diametrical size of the first semiconductor layer 32 of the columnar part 30 is the diameter of a minimum circle including the ellipse inside. This similarly applies to the "diametrical size of the second semiconductor layer of the columnar part" and the "diametrical size of the light emitting layer of the columnar part."

In the illustrated example, the largest diametrical size of a portion constituted only by the light emitting layer of the columnar part 30 is larger than the largest diametrical size of a portion constituted only by the first semiconductor layer 32 of the columnar part 30, and the largest diametrical size of a portion constituted only by the second semiconductor layer 36 of the columnar part 30.

Here, the largest diametrical size of the columnar part 30 between the position B3 and the position T3 in the laminating direction is defined as a first diametrical size. In the illustrated example, the first diametrical size is equal to the diametrical size D3. In the entire area between the position B3 and the position B1 in the laminating direction, the columnar part 30 has a diametrical size no larger than the first diametrical size. In at least a part of the area between the position B3 and the position B1 in the laminating direction, the columnar part 30 has a diametrical size smaller than the first diametrical size. In the illustrated example, in the entire area between the position B3 and the position B1 in the laminating direction, the columnar part 30 has a diametrical size smaller then the first diametrical size.

In the entire area between the position T3 and the position T2 in the laminating direction, the columnar part 30 has a diametrical size no larger than the first diametrical size. In at least a part of the area between the position T3 and the position T2 in the laminating direction, the columnar part 30 has a diametrical size smaller than the first diametrical size. In the illustrated example, in the entire area between the position T3 and the position T2 in the laminating direction, the columnar part 30 has a diametrical size smaller then the first diametrical size.

As shown in FIG. 3, the columnar part 30 has, for example, a first portion 40, a second portion 42, and a third portion 44. The first portion 40 is a portion which is formed only of the first semiconductor layer 32 of the columnar part 30, and has a diametrical size of D1. The first center C1 is located in, for example, the first portion 40. The second portion 42 is a portion which is formed only of the second semiconductor layer 36 of the columnar part 30, and has a diametrical size of D2. The second center C2 is located in, for example, the second portion 42. The third portion 44 is a portion which is formed only of the light emitting layer 34 of the columnar part 30, and has a diametrical size of D3. The third center C3 is located in, for example, the third portion 44.

As shown in FIG. 1, in the columnar parts 30 adjacent to each other, one of the columnar parts 30 and the other of the columnar parts 30 have contact with each other at a position P of the third center C3 in the laminating direction. In the illustrated example, in the columnar parts 30 adjacent to each other, the barrier layer 34b of the light emitting layer 34 of one of the columnar parts 30 and the barrier layer 34b of the light emitting layer 34 of the other of the columnar parts 30 have contact with each other at the position P. The columnar parts 30 adjacent to each other have a bridged structure with the light emitting layers 34. Between first semiconductor layers 32 of the columnar parts 30 adjacent to each other, there is, for example, an air gap. Between second semiconductor layers 36 of the columnar parts 30 adjacent to each other, there is, for example, an air gap.

In the columnar parts 30 adjacent to each other, a crystal defect is located in an interface 2 between one of the columnar parts 30 and the other of the columnar parts 30 at the position P of the third center C3 in the laminating direction. Since the light emitting layer 34 of one of the columnar parts 30 and the light emitting layer 34 of the other of the columnar parts 30 are each deposited by epitaxial growth, the light emitting layer 34 of one of the columnar parts 30 and the light emitting layer 34 of the other of the columnar parts 30 are not continuously deposited. Therefore, there exists the crystal defect as a lattice defect in the interface 2 between the light emitting layer 34 of one of the columnar parts 30 and the light emitting layer 34 of the other of the columnar parts 30. The crystal defect can be observed by a transmission electron microscope (TEM). Further, there can exist a portion where the crystal continues in the light emitting layer 34 of one of the columnar parts 30 and the light emitting layer 34 of the other of the columnar parts 30.

The first electrode 50 is disposed on the buffer layer 22. It is also possible for the buffer layer 22 to have ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one of the electrodes for injecting the electrical current into the light emitting layer 34. As the first electrode 50, there is used, for example, what is obtained by stacking a Cr layer, an Ni layer, and an Au layer in this order from the buffer layer 22 side.

The second electrode 52 is disposed on the second semiconductor layer 36. The second electrode 52 is electrically coupled to the second semiconductor layer 36. The second electrode 52 is the other of the electrodes for injecting the electrical current into the light emitting layer 34. As the second electrode 52, there is used, for example, ITO (indium tin oxide).

It should be noted that although not shown in the drawings, a contact layer can also be disposed between the second semiconductor layer 36 and the second electrode 52. The contact layer is, for example, a p-type GaN layer. The contact layer can be provided to each of the columnar parts 30 to constitute the columnar part 30, or can also be a single layer disposed so as to straddle the plurality of columnar parts 30.

In the light emitting device 100, a pin diode is constituted by the second semiconductor layer 36 of the p-type, the light emitting layer 34 of the i-type, and the first semiconductor layer 32 of the n-type. In the light emitting device 100, when applying a forward bias voltage of the pin diode between the first electrode 50 and the second electrode 52, the electrical current is injected into the light emitting layer 34, and recombination of electrons and holes occurs in the light emitting layer 34. The recombination causes light emission. The light generated in the light emitting layer 34 propagates in an in-plane direction due to the first semiconductor layer 32 and the second semiconductor layer 36 to form a standing wave due to the effect of the photonic crystal caused by the plurality of columnar parts 30, and is then gained by the light emitting layer 34 to cause laser oscillation. Then, the light emitting device 100 emits positive first-order diffracted light and negative first-order diffracted light as a laser beam in the laminating direction.

In the light emitting device 100, it is possible to realize a surface-emitting device extremely narrow in angular distribution due to the effect of the photonic crystal. The light emitting device 100 is applied as a projector light source or an illuminating light source.

It should be noted that although the light emitting layer 34 of the InGaN type is described above, as the light emitting layer 34, there can be used a variety of types of material system capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

The light emitting device 100 can exert, for example, the following functions and advantages.

In the light emitting device 100, assuming the largest diametrical size of the columnar part 30 between the position B3 and the position T3 in the laminating direction as the first diametrical size, the columnar part 30 has a diametrical size no larger than the first diametrical size in the entire area between the position B3 and the position B1 in the laminating direction, and the columnar part 30 has a diametrical size smaller than the first diametrical size in at least a part of the area between the position B3 and the position B1 in the laminating direction. Further, the columnar part 30 has a diametrical size no larger than the first diametrical size in the entire area between the position T3 and the position T2 in the laminating direction, and the columnar part 30 has a diametrical size smaller than the first diametrical size in at least a part of the area between the position T3 and the position T2 in the laminating direction. Therefore, it is possible to make the average refractive index in the in-plane direction in the columnar part 30 between the position B3 and the position T3 higher than the average refractive index in the in-plane direction in the columnar part 30 between the position B3 and the position T1, and the average refractive index in the in-plane direction in the columnar part 30 between the position T3 and the position T2. Thus, in the light emitting device 100, it is possible to improve the optical confinement factor compared to when, for example, the diametrical size of the columnar part between the position B1 and the position T2 in the laminating direction is the same. As a result, it is possible to improve the performance of the light emitting device such as reduction in oscillator threshold value. It should be noted that FIG. 1 shows a graph representing the light intensity with respect to the position in the laminating direction in the light emitting device 100.

Further, in the light emitting device 100, since the average refractive index in the in-plane direction in the columnar part 30 is not controlled by embedding a material between the columnar parts 30 adjacent to each other, for example, it is possible to easily and surely adjust the average refractive index.

In the light emitting device 100, the columnar part 30 has a diametrical size smaller than the first diametrical size in the entire area between the position B3 and the position B1 in the laminating direction, and the columnar part 30 has a diametrical size smaller than the first diametrical size in the entire area between the position T3 and the position T2 in the laminating direction. Therefore, in the light emitting device 100, it is possible to more surely improve the optical confinement factor.

In the light emitting device 100, the diametrical size D3 at the third center C3 of the columnar part 30 is larger than the diametrical size D1 at the first center C1 of the columnar part 30, and the diametrical size D2 at the second center C2 of the columnar part 30. Therefore, it is possible to make the average refractive index in the in-plane direction at the third center C3 higher than the average refractive index in the in-plane direction at the first center C1 and the average refractive index in the in-plane direction at the second center C2. Thus, in the light emitting device 100, it is possible to improve the optical confinement factor compared to when, for example, the diametrical sizes D1, D2, and D3 are equal to each other.

In the light emitting device 100, in the columnar parts 30 adjacent to each other, one of the columnar parts 30 and the other of the columnar parts 30 have contact with each other at the position P of the third center C3 in the laminating direction. Therefore, in the light emitting device 100, it is possible to increase the average refractive index in the in-plane direction at the third center C3 compared to when one of the columnar parts 30 and the other of the columnar parts 30 are separated from each other.

In the light emitting device 100, in the columnar parts 30 adjacent to each other, the barrier layer 34b of one of the columnar parts 30 and the barrier layer 34b of the other of the columnar parts 30 have contact with each other at the position P of the third center C3 in the laminating direction. Therefore, in the light emitting device 100, it is possible to locate the well layers 34a at a distance from the crystal defect generated in the interface 2. Thus, it is possible to reduce the electrical current which results in non-light emitting recombination via the crystal defect.

1.2. Method of Manufacturing Light Emitting Device

Figure 4:
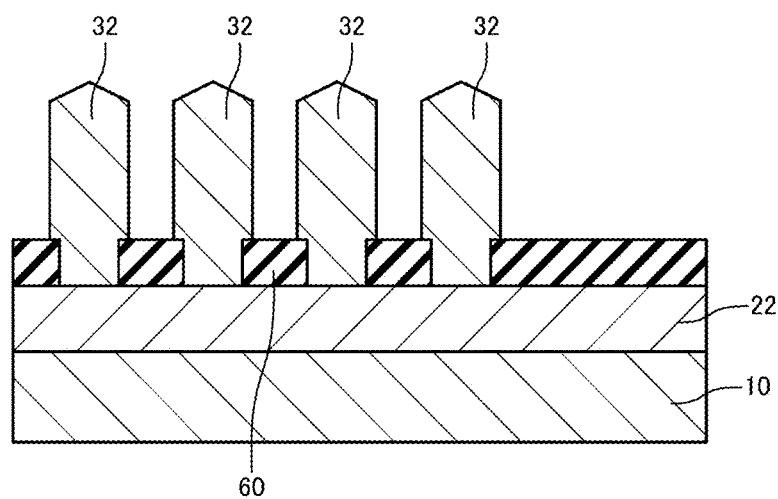
FIG. 4 is a cross-sectional view schematically showing a manufacturing process of the light emitting device according to the first embodiment.
Figure 5:
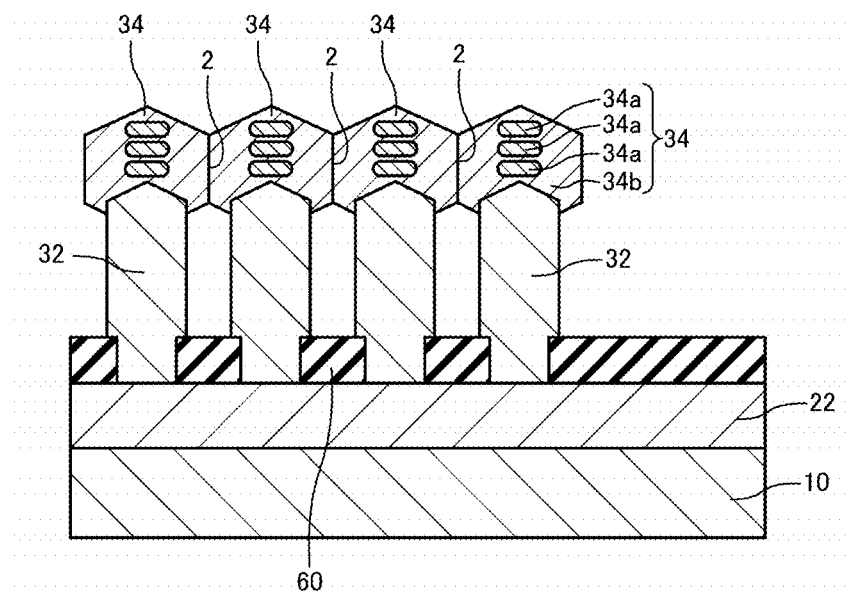
FIG. 5 is a cross-sectional view schematically showing the manufacturing process of the light emitting device according to the first embodiment.

Then, a method of manufacturing the light emitting device 100 according to the first embodiment will be described with reference to the drawings. FIG. 4 and FIG. 5 are cross-sectional views schematically showing a manufacturing process of the light emitting device 100 according to the first embodiment.

As shown in FIG. 4, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the mask layer 60 is formed on the buffer layer 22. The mask layer 60 can be formed by periodically forming opening parts in a film deposited on the buffer layer 22 using, for example, a sputtering method or an EB (Electron Beam) method. The formation of the opening parts is achieved by, for example, patterning with photolithography and dry etching, or patterning with EB lithography and dry etching.

Then, the first semiconductor layers 32 are grown epitaxially on the buffer layer 22 using the mask layer 60 as a mask. As the method of achieving the epitaxial growth, there can be cited, for example, the MOCVD method and the MBE method.

As shown in FIG. 5, the light emitting layers 34 are grown epitaxially on the first semiconductor layers 32, respectively. As the method of achieving the epitaxial growth, there can be cited, for example, the MOCVD method and the MBE method. For example, when forming the light emitting layers 34 each having the well layers 34a as the InGaN layers and the barrier layers 34b as the GaN layers, by adjusting the growth temperature or the ratio between In and GaN, it is possible to collect In around the center of each of the light emitting layers 34. Thus, it is possible to form the InGaN layer surrounded by the GaN layer in the plan view.

The light emitting layers 34 are grown in the growth condition of promoting the growth in a lateral direction (the in-plane direction), and thus, the light emitting layers 34 of the columnar parts 30 adjacent to each other are made to have contact with each other. For example, by adjusting the growth temperature and the ratio between the atoms in the group III and the atoms in the group V of the light emitting layer 34, it is possible to promote the growth in the lateral direction. When growing the light emitting layer 34 using the MOCVD, it is possible to adjust the ratio between the atoms in the group III and the atoms in the group V of the light emitting layer 34 in pulse supply.

As shown in FIG. 1, the second semiconductor layers 36 are grown epitaxially on the light emitting layers 34, respectively. As the method of achieving the epitaxial growth, there can be cited, for example, the MOCVD method and the MBE method.

Due to the process described hereinabove, it is possible to form the columnar parts 30.

Then, the second electrode 52 is formed on the columnar parts 30. Then, the first electrode 50 is formed on the buffer layer 22. The first electrode 50 and the second electrode 52 are formed using, for example, a vacuum deposition method. It should be noted that the order of forming the first electrode 50 and the second electrode 52 is not particularly limited.

Due to the process described hereinabove, it is possible to manufacture the light emitting device 100.

1.3. Modified Examples of Light Emitting Device

Figure 6:
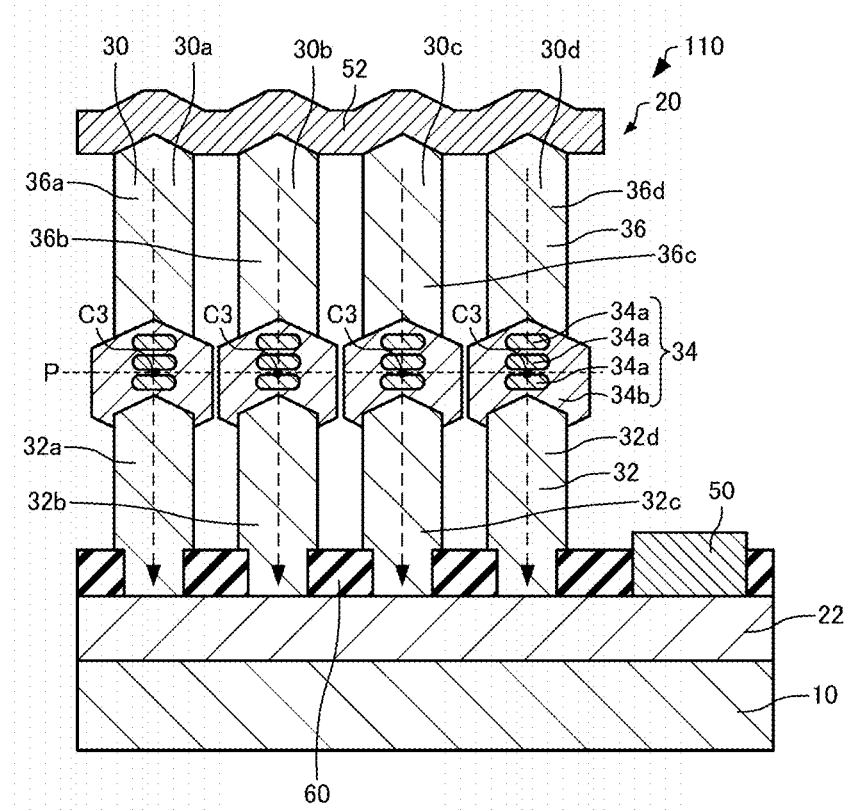
FIG. 6 is a cross-sectional view schematically showing a light emitting device according to a modified example of the first embodiment.

Then, a light emitting device according to a modified example of the first embodiment will be descried with reference to the drawings. FIG. 6 is a cross-sectional view schematically showing the light emitting device 110 according to the modified example of the first embodiment.

Hereinafter, in the light emitting device 110 according to the modified example of the first embodiment, the members having substantially the same functions as those of the constituent members of the light emitting device 100 according to the first embodiment described above will be denoted by the same reference symbols, and detailed descriptions thereof will be omitted.

In the light emitting device 100 described above, as shown in FIG. 1, in the columnar parts 30 adjacent to each other, one of the columnar parts 30 and the other of the columnar parts 30 have contact with each other at the position P of the third center C3 in the laminating direction.

In contrast, in the light emitting device 110, as shown in FIG. 6, in the columnar parts 30 adjacent to each other, one of the columnar parts 30 and the other of the columnar parts 30 are separated from each other. In the columnar parts 30 adjacent to each other, the light emitting layer 34 of one of the columnar parts 30 and the light emitting layer 34 of the other of the columnar parts 30 are separated from each other. The distance between the light emitting layer 34 of one of the columnar parts 30 and the light emitting layer 34 of the other of the columnar parts 30 is, for example, no smaller than 10 nm and no larger than 50 nm.

In the method of manufacturing the light emitting device 110, the light emitting layers 34 are grown in the lateral direction to the extent that in the columnar parts 30 adjacent to each other, the light emitting layer 34 of one of the columnar parts 30 and the light emitting layer 34 of the other of the columnar parts 30 do no have contact with each other.

In the light emitting device 110, as described above, in the columnar parts 30 adjacent to each other, one of the columnar parts 30 and the other of the columnar parts 30 are separated from each other. Therefore, it is possible to isolate the columnar parts 30 adjacent to each other. Thus, it is possible to reduce a variation in amount of the current to be injected in to the plurality of columnar parts 30. The reason therefor will hereinafter be described.

As shown in FIG. 6, it is assumed that, for example, when forming four columnar parts 30a, 30b, 30c, and 30d, the first semiconductor layer 32b becomes high in resistance, and the first semiconductor layers 32a, 32c, and 32d become low in resistance due to a manufacturing tolerance. Further, it is assumed that when forming the four columnar parts 30a, 30b, 30c, and 30d, the second semiconductor layers 36a, 36c, and 36d become high in resistance, and the second semiconductor 36b becomes low in resistance due to the manufacturing tolerance.

In this case, when the columnar parts 30 adjacent to each other are isolated from each other as in the case of the light emitting device 110, the resistance of the columnar part 30a becomes a sum of the resistance of the first semiconductor layer 32a and the resistance of the second semiconductor layer 36a. Substantially the same applies to the columnar parts 30b, 30c, and 30d. The electrical current flows into the first semiconductor layers 32a, 32b, 32c, and 32d through the second semiconductor layers 36a, 36b, 36c, and 36d of the columnar parts 30a, 30b, 30c, and 30d, respectively, as represented by the dotted arrows shown in FIG. 6.

Figure 7:
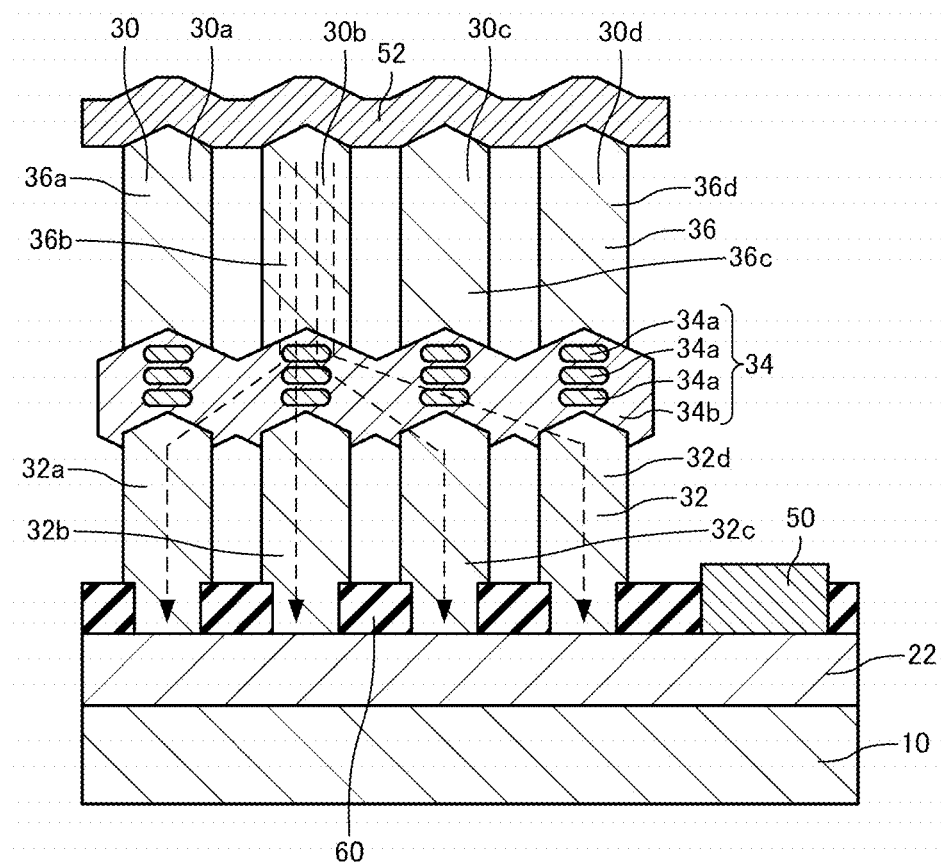
FIG. 7 is a cross-sectional view schematically showing a light emitting device according to a reference example.

As shown in FIG. 7, when the columnar parts 30 adjacent to each other have contact with each other in the light emitting layers 34, the electrical current flows through the second semiconductor layer 36b low in resistance with priority, and then flows through the first semiconductor layers 32a, 32c, and 32d low in resistance with priority via the light emitting layers 34.

In the light emitting device 110, the well layers 34a are made separated from a sidewall of the columnar part 30. Thus, it is possible to reduce the electrical current which results in non-light emitting recombination in the vicinity of the sidewall of the columnar part 30.

Further, in the light emitting device 110, since the columnar parts 30 adjacent to each other are insulated with the air gap between the columnar parts 30 adjacent to each other, a distortion hardly occurs in the columnar part 30. For example, when disposing an insulating layer between the columnar parts 30 adjacent to each other to insulate the columnar parts 30 adjacent to each other, there is a possibility that a distortion occurs in a temperature-falling process in the manufacture due to a difference in thermal expansion between the columnar part 30 and the insulating layer, and thus, the crystal defect is induced.

In the light emitting device 100 and the light emitting device 110 described above, as respectively shown in FIG. 3 and FIG. 6, the diametrical size D1 at the first center C1 of the columnar part 30 and the diametrical size D2 at the second center C2 of the columnar part 30 are equal to each other. Besides the above, it is possible for the diametrical size D2 at the second center C2 of the columnar part 30 to be smaller than the diametrical size D1 at the first center C1 of the columnar part 30.

For example, by using the GaN layer as the first semiconductor layer 32, and using the InGaN layer high in lattice constant than the GaN layer as the second semiconductor layer 36, it is possible to make the diametrical size D2 smaller than the diametrical size D1 using a raw material the crystal of which voluntarily agglutinates in order to avoid the occurrence of the distortion.

Figure 8:
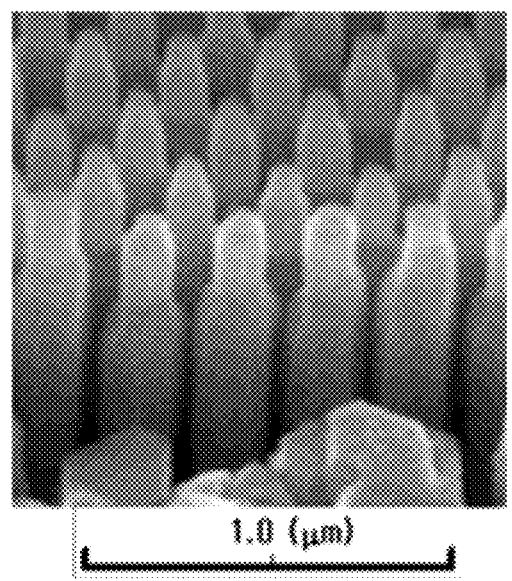
FIG. 8 is a diagram showing an SEM image of the columnar parts.

FIG. 8 is an SEM image (a bird's-eye view) of the columnar part formed by an MBE method. As shown in FIG. 8, it shows the fact that a portion of the p-type InGaN layer (an upper part of the columnar part) is made smaller in diametrical size compared to the other portion.

It should be noted that it is possible to make the diametrical size D2 smaller than the diametrical size D1 by etching the second semiconductor layer 36.

It is possible for the diametrical size D2 at the second center C2 of the columnar part 30 to be smaller than the diametrical size D1 at the first center C1 of the columnar part 30. In this case, it is possible to make the average refractive index in the in-plane direction at the second center C2 lower than the average refractive index in the in-plane direction at the first center C1. Thus, it is possible to prevent, for example, the light generated in the light emitting layer 34 from being absorbed by the second electrode 52.

Further, it is also possible to dispose an insulating layer between the columnar parts 30 adjacent to each other. In the plan view, the insulating layer is disposed around the columnar part 30. The light generated in the light emitting layer 34 passes through the insulating layer to propagate in the in-plain direction. The insulating layer is, for example, a silicon oxide layer. The insulating layer is formed using, for example, an ALD (Atomic Layer Deposition) method.

2. Second Embodiment

2.1. Light Emitting Device

Figure 9:
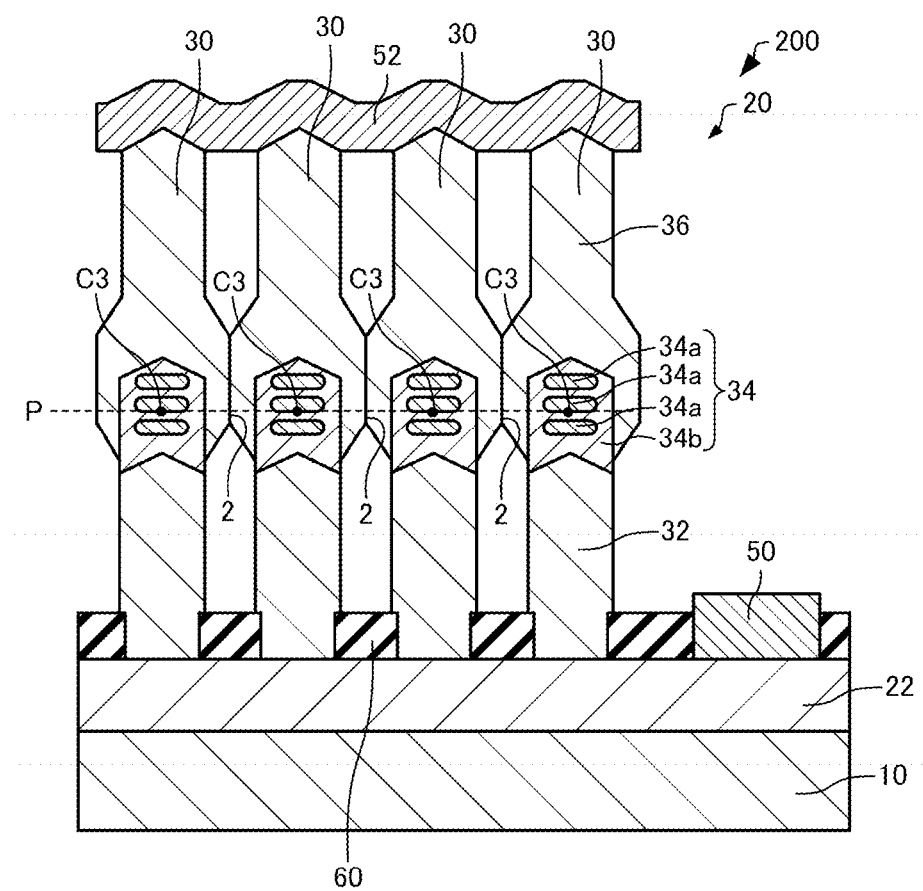
FIG. 9 is a cross-sectional view schematically showing a light emitting device according to a second embodiment.
Figure 10:
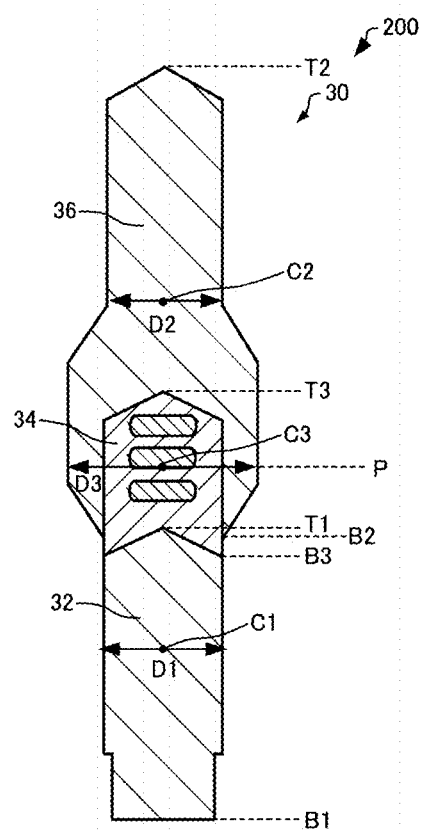
FIG. 10 is a cross-sectional view schematically showing a columnar part of the light emitting device according to the second embodiment.

Then, a light emitting device according to a second embodiment will be described with reference to the drawings. FIG. 9 is a cross-sectional view schematically showing the light emitting device 200 according to the second embodiment. FIG. 10 is a cross-sectional view schematically showing the columnar part 30 of the light emitting device 200 according to the second embodiment.

Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

In the light emitting device 100 described above, as shown in FIG. 1, in the columnar parts 30 adjacent to each other, the barrier layer 34b of one of the columnar parts 30 and the barrier layer 34b of the other of the columnar parts 30 have contact with each other at the position P of the third center C3 in the laminating direction.

In contrast, in the light emitting device 200, as shown in FIG. 9, in the columnar parts 30 adjacent to each other, the second semiconductor layer 36 of one of the columnar parts 30 and the second semiconductor layer 36 of the other of the columnar parts 30 have contact with each other at the position P of the third center C3 in the laminating direction. In the columnar parts 30 adjacent to each other, the light emitting layer 34 of one of the columnar parts 30 and the light emitting layer 34 of the other of the columnar parts 30 are separated from each other at the position P. The columnar parts 30 adjacent to each other have a bridged structure with the second semiconductor layers 36. The interface 2 is formed of the second semiconductor layer 36. In the light emitting device 200, it is possible to locate the light emitting layer 34 at a distance from the interface 2 where the crystal defect occurs. Thus, it is possible to reduce the electrical current which results in non-light emitting recombination via the crystal defect.

As shown in FIG. 9 and FIG. 10, in the light emitting device 200, the second semiconductor layer 36 is disposed around the light emitting layer 34 in the plan view. The second semiconductor layer 36 is disposed on a side surface and an upper surface of the light emitting layer 34. Therefore, in the light emitting device 200, it is possible to make the contact area between the second semiconductor layer 36 and the light emitting layer 34 larger compared to when the second semiconductor layer 36 is disposed only on the upper surface of the light emitting layer 34. Thus, it is possible to efficiently inject the electrical current into the light emitting layer 34. As a result, it is possible to improve the homogeneity of the recombination distribution in the light emitting layer 34. Further, it is possible to suppress the non-light emitting recombination in the barrier layer 34b of the light emitting layer 34, and thus, it is possible to improve the luminous efficiency. The second semiconductor layer 36 as the p-type semiconductor layer is lower in conductivity than the first semiconductor layer 32 as the n-type semiconductor layer. Therefore, it is preferable to increase the contact area between the second semiconductor layer 36 and the light emitting layer 34. The first semiconductor layer 32 and the second semiconductor layer 36 disposed around the light emitting layer 34 are separated from each other. The position B3 is located at the substrate 10 side of the position B2. The position B2 is located between the position T1 and the position B3 in the laminating direction.

In the illustrated example, the largest diametrical size of a portion formed only of the light emitting layer 34 of the columnar part 30 and the largest diametrical size of a portion formed only of the first semiconductor layer 32 of the columnar part 30 are equal to each other. Although the columnar part 30 has a diametrical size equal to the first diametrical size in a part of the area between the position T3 and the position T2 in the laminating direction, the columnar part 30 has a diametrical size smaller than the first diametrical size in another part of the area between the position T3 and the position T2 in the laminating direction. Further, in the entire area between the position B3 and the position B1, the columnar part 30 has a diametrical size smaller than the first diametrical size.

2.2. Method of Manufacturing Light Emitting Device

Figure 11:
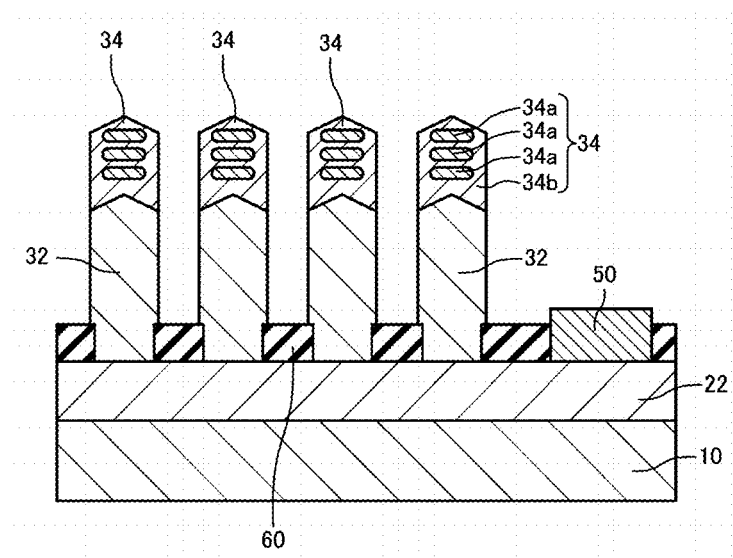
FIG. 11 is a cross-sectional view schematically showing a manufacturing process of the light emitting device according to the second embodiment.

Then, a method of manufacturing the light emitting device 200 according to the second embodiment will be described with reference to the drawings. FIG. 11 is a cross-sectional view schematically showing a manufacturing process of the light emitting device 200 according to the second embodiment.

In the method of manufacturing the light emitting device 200, as shown in FIG. 11, the light emitting layers 34 are grown so that the largest diametrical size of the portion formed only of the light emitting layer 34 of the columnar part 30 and the largest diametrical size of the portion formed only of the first semiconductor layer 32 of the columnar part 30 become equal to each other.

Then, as shown in FIG. 9, the p-type semiconductor layer is grown in the condition of growing so as to cover the side surface and the upper surface of the light emitting layer 34, and then, the p-type semiconductor layer is grown in the state of suppressing the growth in the lateral direction. Thus, it is possible to form the second semiconductor layers 36.

Besides the above, the method of manufacturing the light emitting device 200 is basically the same as the method of manufacturing the light emitting device 100.

2.3. Modified Example of Light Emitting Device

Figure 12:
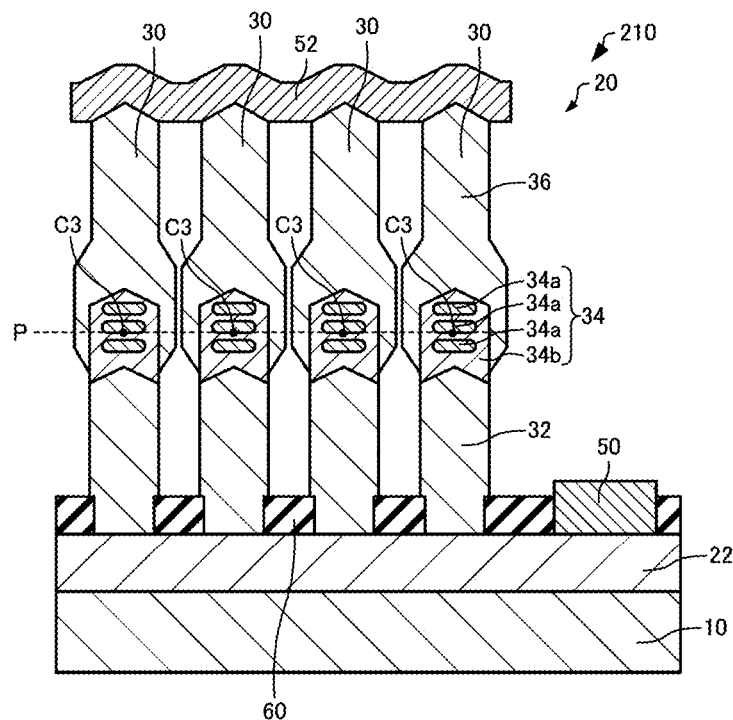
FIG. 12 is a cross-sectional view schematically showing a light emitting device according to a modified example of the second embodiment.

Then, a light emitting device according to a modified example of the second embodiment will be descried with reference to the drawings. FIG. 12 is a cross-sectional view schematically showing the light emitting device 210 according to the modified example of the second embodiment.

Hereinafter, in the light emitting device 210 according to the modified example of the second embodiment, the members having substantially the same functions as those of the constituent members of the light emitting device 200 according to the second embodiment described above will be denoted by the same reference symbols, and detailed descriptions thereof will be omitted.

In the light emitting device 200 described above, as shown in FIG. 9, in the columnar parts 30 adjacent to each other, one of the columnar parts 30 and the other of the columnar parts 30 have contact with each other at the position P of the third center C3 in the laminating direction.

In contrast, in the light emitting device 210, as shown in FIG. 12, in the columnar parts 30 adjacent to each other, one of the columnar parts 30 and the other of the columnar parts 30 are separated from each other. In the columnar parts 30 adjacent to each other, the second semiconductor layer 36 of one of the columnar parts 30 and the second semiconductor layer 36 of the other of the columnar parts 30 are separated from each other.

In the method of manufacturing the light emitting device 210, the second semiconductor layers 36 are grown in the lateral direction to the extent that in the columnar parts 30 adjacent to each other, the second semiconductor layer 36 of one of the columnar parts 30 and the second semiconductor layer 36 of the other of the columnar parts 30 do no have contact with each other.

In the light emitting device 210, in the columnar parts 30 adjacent to each other, one of the columnar parts 30 and the other of the columnar parts 30 are separated from each other, and therefore, it is possible to reduce the variation in amount of the electrical current to be injected into the plurality of columnar parts 30 similarly to the light emitting device 110 described above.

3. Third Embodiment

Figure 13:
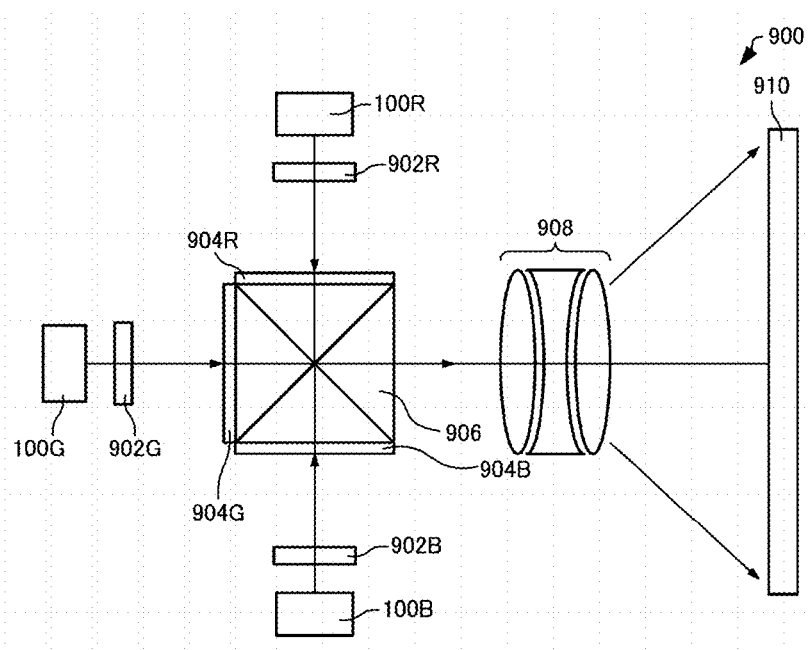
FIG. 13 is a diagram schematically showing a projector according to a third embodiment.

Then, a projector according to a third embodiment will be described with reference to the drawing. FIG. 13 is a diagram schematically showing the projector 900 according to the third embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 13, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiment described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

In the present disclosure, some of the constituents can be omitted, or the embodiments and the modified example can be combined with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration denotes a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages or configurations capable of achieving the same object as that of the configurations explained in the description of the embodiments. Further, the present disclosure includes configurations obtained by adding a known technology to the configuration explained in the description of the embodiments.

What is claimed is:

1. A light emitting device comprising:
    a substrate; and
    a laminated structure provided to the substrate, and including a buffer layer and a plurality of columnar parts disposed on the buffer layer, wherein
    the columnar part includes
        a first semiconductor layer,
        a second semiconductor layer different in conductivity type from the first semiconductor layer, and
        a light emitting layer disposed between the first semiconductor layer and the second semiconductor layer,
    the first semiconductor layer is disposed between the substrate and the light emitting layer,
    between an end at the substrate side of the light emitting layer in a laminating direction of the first semiconductor layer and the light emitting layer, and an end at an opposite side to the substrate of the light emitting layer in the laminating direction, a largest diametrical size of the columnar part is defined as a first diametrical size,
    the columnar part has a diametrical size no larger than the first diametrical size in an entire area between the end at the substrate side of the light emitting layer and an end at the substrate side of the first semiconductor layer in the laminating direction,
    the columnar part has a diametrical size smaller than the first diametrical size in at least a part of the area between the end at the substrate side of the light emitting layer in the laminating direction and the end at the substrate side of the first semiconductor layer,
    the columnar part has a diametrical size no larger than the first diametrical size in an entire area between the end at the opposite side to the substrate of the light emitting layer, and an end at an opposite side to the substrate of the second semiconductor layer in the laminating direction,
    the columnar part has a diametrical size smaller than the first diametrical size in at least a part of the area between the end at the opposite side to the substrate of the light emitting layer in the laminating direction, and the end at the opposite side to the substrate of the second semiconductor layer, and
    in the columnar parts adjacent to each other, one of the columnar parts and another of the columnar parts have direct contact with each other.

2. The light emitting device according to claim 1, wherein
    the columnar part has a diametrical size smaller than the first diametrical size in an entire area between the end at the substrate side of the light emitting layer in the laminating direction and the end at the substrate side of the first semiconductor layer, and
    the columnar part has a diametrical size smaller than the first diametrical size in the entire area between the end at the opposite side to the substrate of the light emitting layer in the laminating direction, and the end at the opposite side to the substrate of the second semiconductor layer.

3. The light emitting device according to claim 1, wherein
    the first semiconductor layer has a first center in the laminating direction,
    the second semiconductor layer has a second center in the laminating direction,
    the light emitting layer has a third center in the laminating direction, and
    a diametrical size of the columnar part at the third center is larger than a diametrical size of the columnar part at the first center, and a diametrical size of the columnar part at the second center.

4. The light emitting device according to claim 3, wherein
    in the columnar parts adjacent to each other, the one of the columnar parts and the other of the columnar parts have contact with each other at a position at the third center in the laminating direction.

5. The light emitting device according to claim 4, wherein
    there is a crystal defect in an interface between the one of the columnar parts and the other of the columnar parts at the position of the third center in the laminating direction.

6. The light emitting device according to claim 4, wherein
    the light emitting layer includes
        a well layer, and
        a barrier layer larger in bandgap than the well layer, and
    the barrier layer of the one of the columnar parts and the barrier layer of the other of the columnar parts have contact with each other at the position of the third center in the laminating direction.

7. The light emitting device according to claim 4, wherein
    in a plan view from the laminating direction, the second semiconductor layer is disposed around the light emitting layer, and
    the second semiconductor layer of the one of the columnar parts and the second semiconductor layer of the other of the columnar parts have contact with each other at the position of the third center in the laminating direction.

8. The light emitting device according to claim 3, wherein
    the diametrical size at the second center of the columnar part is smaller than the diametrical size at the first center of the columnar part.

9. The light emitting device according to claim 1, wherein in a plan view from the laminating direction, the second semiconductor layer is disposed around the light emitting layer.

10. A projector comprising:
the light emitting device according to claim 1.

11. A light emitting device comprising:
a substrate; and
a laminated structure provided to the substrate, and including a plurality of columnar parts, wherein
the columnar part includes
a first semiconductor layer,
a second semiconductor layer different in conductivity type from the first semiconductor layer, and
a light emitting layer disposed between the first semiconductor layer and the second semiconductor layer,
the first semiconductor layer is disposed between the substrate and the light emitting layer,
between an end at the substrate side of the light emitting layer in a laminating direction of the first semiconductor layer and the light emitting layer, and an end at an opposite side to the substrate of the light emitting layer in the laminating direction, a largest diametrical size of the columnar part is defined as a first diametrical size,
the columnar part has a diametrical size no larger than the first diametrical size in an entire area between the end at the substrate side of the light emitting layer and an end at the substrate side of the first semiconductor layer in the laminating direction,
the columnar part has a diametrical size smaller than the first diametrical size in at least a part of the area between the end at the substrate side of the light emitting layer in the laminating direction and the end at the substrate side of the first semiconductor layer,
the columnar part has a diametrical size no larger than the first diametrical size in an entire area between the end at the opposite side to the substrate of the light emitting layer, and an end at an opposite side to the substrate of the second semiconductor layer in the laminating direction,
the columnar part has a diametrical size smaller than the first diametrical size in at least a part of the area between the end at the opposite side to the substrate of the light emitting layer
in the laminating direction, and the end at the opposite side to the substrate of the second semiconductor layer, and
in the columnar parts adjacent to each other, one of the columnar parts and another of the columnar parts have direct contact with each other, wherein
the first semiconductor layer has a first center in the laminating direction,
the second semiconductor layer has a second center in the laminating direction,
the light emitting layer has a third center in the laminating direction,
in the columnar parts adjacent to each other, the one of the columnar parts and the other of the columnar parts have contact with each other at a position at the third center in the laminating direction, and
there is a crystal defect in an interface between the one of the columnar parts and the other of the columnar parts at the position of the third center in the laminating direction.

12. A light emitting device comprising:
a substrate; and
a laminated structure provided to the substrate, and including a plurality of columnar parts, wherein
the columnar part includes
a first semiconductor layer,
a second semiconductor layer different in conductivity type from the first semiconductor layer, and
a light emitting layer disposed between the first semiconductor layer and the second semiconductor layer,
the first semiconductor layer is disposed between the substrate and the light emitting layer,
between an end at the substrate side of the light emitting layer in a laminating direction of the first semiconductor layer and the light emitting layer, and an end at an opposite side to the substrate of the light emitting layer in the laminating direction, a largest diametrical size of the columnar part is defined as a first diametrical size,
the columnar part has a diametrical size no larger than the first diametrical size in an entire area between the end at the substrate side of the light emitting layer and an end at the substrate side of the first semiconductor layer in the laminating direction,
the columnar part has a diametrical size smaller than the first diametrical size in at least a part of the area between the end at the substrate side of the light emitting layer in the laminating direction and the end at the substrate side of the first semiconductor layer,
the columnar part has a diametrical size no larger than the first diametrical size in an entire area between the end at the opposite side to the substrate of the light emitting layer, and an end at an opposite side to the substrate of the second semiconductor layer in the laminating direction,
the columnar part has a diametrical size smaller than the first diametrical size in at least a part of the area between the end at the opposite side to the substrate of the light emitting layer in the laminating direction, and the end at the opposite side to the substrate of the second semiconductor layer, and
in the columnar parts adjacent to each other, one of the columnar parts and another of the columnar parts have direct contact with each other, wherein
the first semiconductor layer has a first center in the laminating direction,
the second semiconductor layer has a second center in the laminating direction,
the light emitting layer has a third center in the laminating direction,
in the columnar parts adjacent to each other, the one of the columnar parts and the other of the columnar parts have contact with each other at a position at the third center in the laminating direction,
in a plan view from the laminating direction, the second semiconductor layer is disposed around the light emitting layer, and
the second semiconductor layer of the one of the columnar parts and the second semiconductor layer of the other of the columnar parts have contact with each other at the position of the third center in the laminating direction.

* * * * *